United States Patent [19]

Kim

[11] Patent Number: 5,305,270
[45] Date of Patent: Apr. 19, 1994

[54] INITIAL SETUP CIRCUIT FOR CHARGING CELL PLATE

[75] Inventor: Toe H. Kim, Seoul, Rep. of Korea

[73] Assignee: Goldstar Electron Co., Ltd., Cheongju, Rep. of Korea

[21] Appl. No.: 960,146

[22] Filed: Oct. 13, 1992

[30] Foreign Application Priority Data

Oct. 10, 1991 [KR] Rep. of Korea ............... 91-16701

[51] Int. Cl.$^5$ .................. G11C 7/00; G11C 5/14
[52] U.S. Cl. ............... 365/203; 365/189.09; 365/226
[58] Field of Search ........... 365/149, 203, 226, 189.09

[56] References Cited

U.S. PATENT DOCUMENTS

| | | | |
|---|---|---|---|
| 4,638,464 | 1/1987 | Cranford, Jr. et al. | 365/226 |
| 4,775,959 | 10/1988 | Sato et al. | 365/189.09 |
| 4,829,482 | 5/1989 | Owen | 365/189.09 |
| 5,209,776 | 5/1993 | Nasu et al. | 365/200 |

Primary Examiner—Eugene R. LaRoche
Assistant Examiner—Michael C. Kessell
Attorney, Agent, or Firm—Alan R. Loudermilk

[57] ABSTRACT

A circuit and method for charging the plate electrodes of a plurality of memory cells. The plate electrodes are initially charged by a voltage generator having a large current driving capacity. After the plate electrodes have reached a predetermined threshold voltage, the large-capacity generator is disconnected or deactivated, and the cells are driven by a second, small capacity generator during a standby period. Switches are responsive to a control signal for selectively enabling and disabling the first and second voltage generators. The control unit initially sets the control signal in accordance with the plate electrode voltage level and a clock signal.

29 Claims, 4 Drawing Sheets

INITIAL SETUP CIRCUIT FOR CHARGING CELL PLATE

FIELD OF THE INVENTION

The present invention relates to electronic memories generally, and in particular to techniques for initially charging the cell capacitors of semiconductor memories.

BACKGROUND OF THE INVENTION

Dynamic random access memory (DRAM), such as found in computers, is used to store binary data. Each location or "cell" of DRAM holds a single "bit" of information, which may have a value of "1" or "0". In each memory cell, this value is represented by the presence or absence of charge on a capacitor. When a DRAM power supply is first turned on or initialized, the plate electrodes of these capacitors are maintained at electrical ground for a short time until the power supply has stabilized. The plate electrodes are then precharged to a predetermined voltage by a voltage generator.

An example of this conventional technique is illustrated in FIG. 1. Conventional circuit 10 includes cell plate voltage generator 12 having an output voltage at node A; switching transistors MN1 and MP1 for connecting and disconnecting the output voltage of voltage generator 12 to and from terminal Vcp, which is connected to the cell plate; switching transistor MN2 for grounding the Vcp terminal; and a signal P-U which activates and deactivates switches MN1, MP1 and MN2.

FIG. 2 is a timing chart which illustrates the operation of conventional circuit 10. After the power supply (shown in FIG. 2 as signal P) is first turned on and has stabilized, signal P-U shifts to a high level. When signal P-U goes high, it turns off transistors MN1 and MP1, thereby isolating node A and terminal Vcp from each other. At the same time, terminal Vcp is coupled to ground by the activation of switching transistor MN2. After a brief time (such as to allow establishment of a back bias voltage), the signal P-U returns to low, thereby activating switching transistors MN1 and MP1 to couple voltage generator 12 to terminal Vcp.

To increase DRAM capacity, one needs to use more cells. This in turn increases the overall capacitance of the plate electrodes. In order to continue charging these larger numbers of plate electrodes in a very short period of time, it is necessary to use a more powerful voltage generator having a larger current driving capacity. Unfortunately, these large capacity generators are continuously operated, even during standby periods. As a result, power losses reach unacceptable levels.

SUMMARY OF THE INVENTION

It is therefore an object of the present invention to provide an initial set-up circuit for quickly charging large numbers of cell plates while reducing power loss during standby periods. In accordance with the invention, a circuit is provided having a first voltage generator with a large current driving capacity, and a second voltage generator with a smaller current driving capacity.

The first generator is used during the initial set up period, when the cells are being first charged. Once the cells have been charged, the first generator is deactivated or disconnected from the plate electrodes. The second, lower capacity generator is then activated or coupled to the plate electrodes to maintain the charge during a standby period.

In the preferred embodiment, the circuit also includes two switching devices, each associated with a different one of the voltage generators. The switching devices selectively activate and deactivate their respective voltage generators. A control module generates a control signal for controlling the switching devices so that the electrode plates are charged initially by the first voltage generator, and thereafter by the second voltage generator.

The control module is preferably a bistable multivibrator such as a flip flop. It accepts as input a clock pulse and a voltage level signal. The clock pulse is generated by a timer when power is first initialized, and serves to initially set the control signal so as to enable the first voltage generator. The voltage level signal is generated by a voltage sensor when the plate electrodes reach a predetermined voltage. It serves to reset the control signal to disable the first voltage generator and enable the second voltage generator.

The two switching devices can activate and deactivate their respective voltage generators in a number of ways. Preferably, the first switching device selectively couples and uncouples the first voltage generator from its power supply, thereby turning the first voltage generator on and off. Alternatively, the first switching device selectively couples and uncouples the first voltage generator from the plate electrode, thereby effectively enabling and disabling the first voltage generator. Like techniques may be used for the second voltage generator. Preferably, the second switch selectively couples and uncouples the second voltage generator from the plate electrode.

DESCRIPTION OF THE PREFERRED EMBODIMENTS

Figure 1:
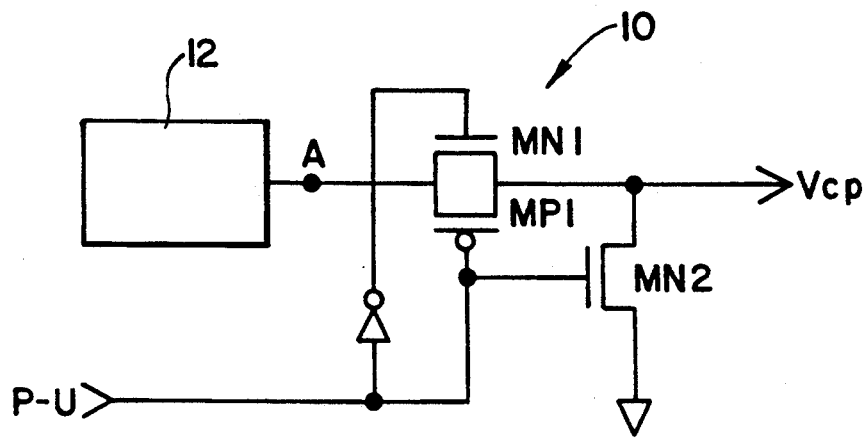
FIG. 1 is block diagram of a conventional set-up circuit for charging cell plates.
Figure 2:
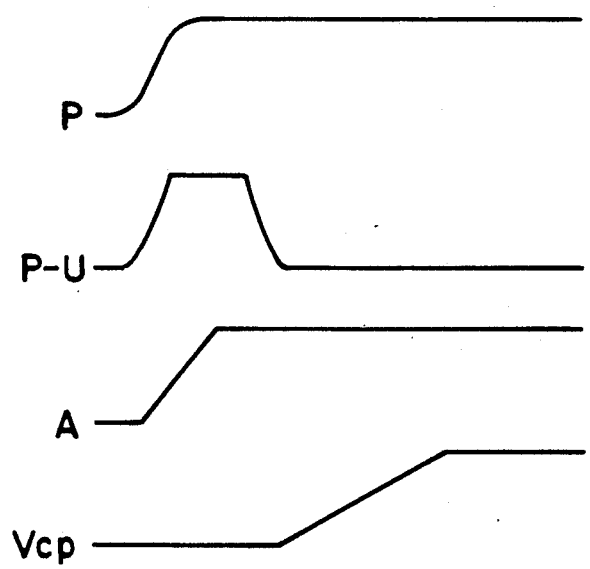
FIG. 2 is a timing chart showing operation of the circuit shown in FIG. 1.
Figure 3:
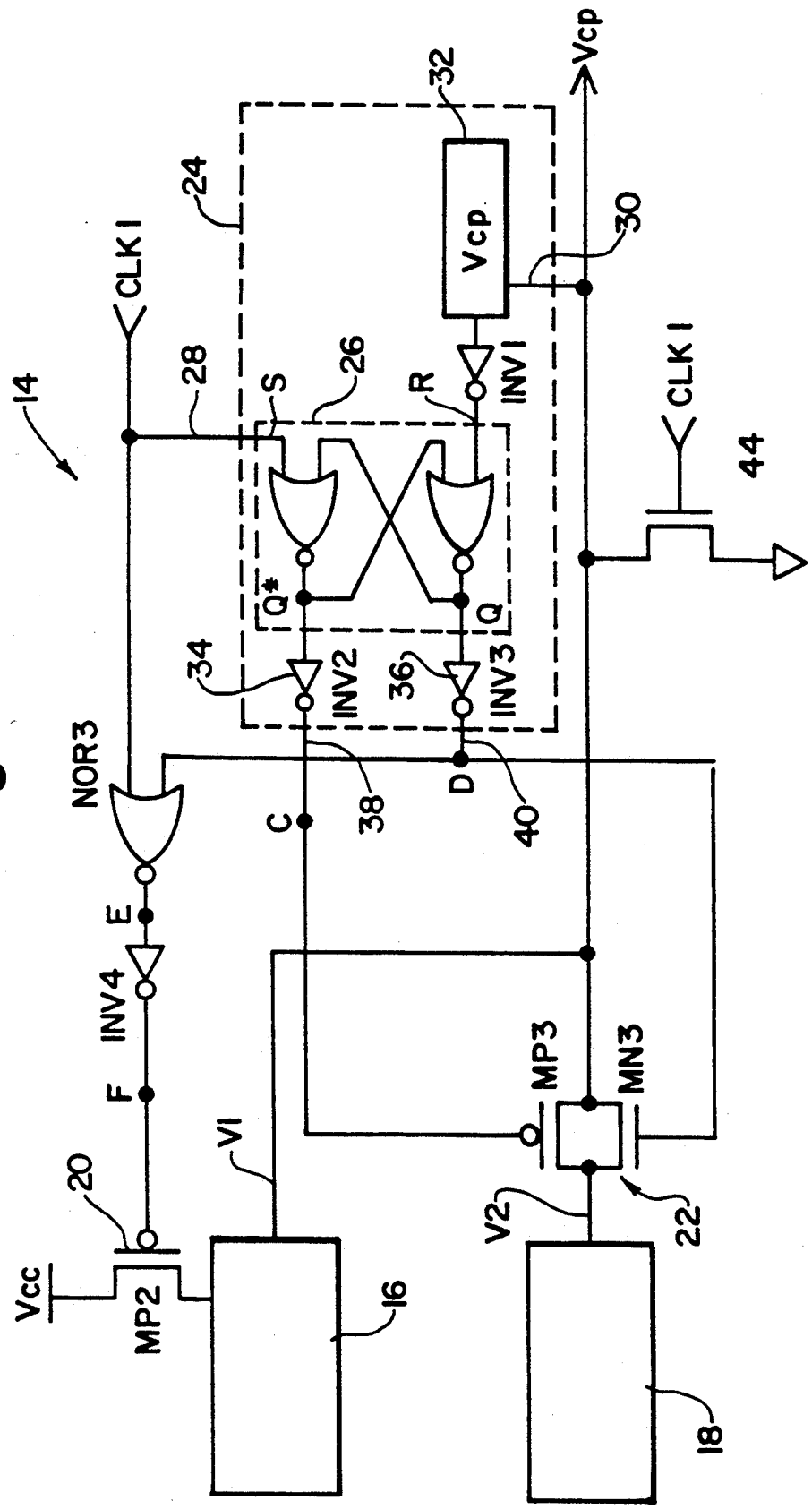
FIG. 3 is a block diagram of a circuit in accordance with one embodiment of the invention.

FIG. 3 illustrates initial set-up circuit 14 in accordance with the invention. Circuit 14 includes first and second voltage generators 16 and 18. First voltage generator 16 receives its power supply via first switching device 20 from power source Vcc. Output V1 of first voltage generator 16 is coupled directly to a plurality of memory cells (not illustrated) by terminal Vcp. Terminal Vcp feeds the plate electrodes for large number of capacitors (not shown) used to store binary data in a memory such as a DRAM. The output terminal V2 of second voltage generator 18 is connected to terminal Vcp via second switching device 22.

Switching devices 20 and 22 can comprise conventional switching transistors (illustrated schematically in FIG. 3 as MP2, MP3 and MN3), and are open and closed by control signals generated by control signal generator 24. Control signal generator includes a bistable multivibrator, such as RS flip flop 26. In this case, the control signals consists of a pair of complementary outputs, which are described below in greater detail.

Inputs 28 and 30 of control signal generator 24 are clock signal CLK1 and terminal Vcp, respectively. Input 30 couples terminal Vcp to a voltage sensor 32. Voltage sensor 32 detects the voltage variations of terminal Vcp. Specifically, sensor 32 generates a pulse when the voltage of terminal Vcp reaches a predetermined threshold (such as one half the voltage Vcc, for example).

If control signal generator 24 uses an RS latch, then the R input of the RS latch is coupled to the output of sensor 32, and the S input of the RS latch is coupled to clock pulse CLK1. In this manner, the clock pulse sets the latch output Q to 1, and the sensor pulse resets the output Q to 0. As shown in FIG. 3, the complementary outputs Q and Q* of latch 26 are inverted by buffer inverters 34 and 36 to provide outputs 38 and 40, respectively, of control signal generator 24. Outputs 38 and 40 constitute the control signals, and are connected to the second switching device via the control gates of transistors MP3 and MN3, respectively. Output signal 40 is also connected to the control gate of the first switching device 20 via NOR gate NOR3 and invertor Inv4.

As will be appreciated, outputs 38 and 40 are complementary, and together constitute control signals having two discrete values or states. In the first state, output 38 (as measured at node C) is high and output 40 (as measured at node D) is low. In this state, the control signal turns on transistor MP2 (provided signal CLK1 is low), activating first voltage generator 16, and allowing it to begin charging the plate electrodes coupled to terminal Vcp. At the same time, transistors MP3 and MN3 of the second switching device 22 are turned off, thus isolating second voltage generator 18 from terminal Vcp.

Conversely, in the second state, output 38 is low, and output 40 is high. In the second state, the control signal turns off transistor MP2, deactivating first voltage generator 16, and turns on transistors MP3 and MN3, coupling second switching device 18 to terminal Vcp.

Figure 4:
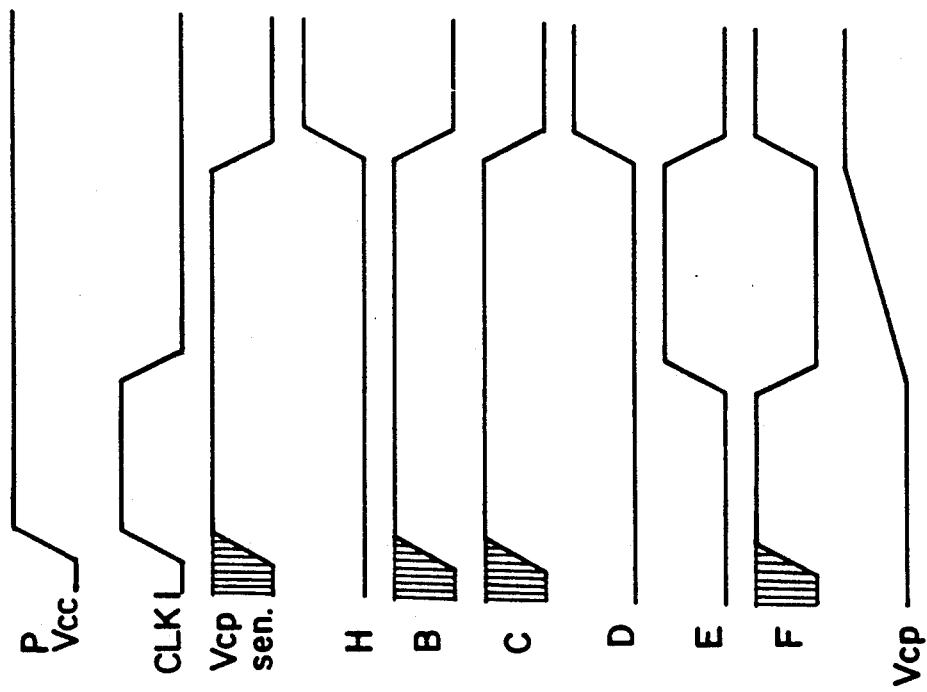
FIG. 4 is a timing chart showing the operation of the circuit shown in FIG. 3.

FIG. 4 is a timing chart illustrating the operation of set-up circuit 14 shown in FIG. 3. Initially, a power supply (shown as signal P-Vcc in FIG. 4) is activated and stabilizes at voltage Vcc. At almost the same time, clock pulse CLK1 shifts to a high level, where it remains for a brief initial time period, such as sufficient to allow establishment of a back bias voltage, for example.

While signal CLK1 remains high, the voltage at node E remains at a low level, keeping the voltage at node F at a high level and thereby off shutting transistor MP2. Referring back to FIG. 3, it will also be noted that a high CLK1 signal activates transistor 44, thus coupling terminal Vcp to ground. Finally, the high signal CLK1 sets flip flop 26 to its first state (Q high, Q* low), leaving output 38 (as measured at node C) high, and output 40 (as measured at node D) low.

During the initial period defined by clock pulse CLK1, the plate electrodes remain at ground. When the clock signal returns to low, flip flop 26 remains in its first state. Switching device 20 is turned on, thereby activating voltage source 14, which begins to charge the plate electrodes coupled to terminal Vcp.

As the voltage level at terminal Vcp begins to rise, it reaches a predetermined threshold (such as, for example, one half of Vcc). At that point voltage sensor 32 output drops from high to low, and a high signal is thereby inputted into the R input of flip flop 26. This resets flip flop 26, complimenting the logic levels of outputs 38 and 40 (as measured at nodes C and D). Specifically, the control signals are toggled into their second state (output 38 low, output 40 high), activating switching device 22 to couple second voltage generator 18 to terminal Vcp. At the same, the low output 40 forces the voltage at node E low, which forces the voltage at node F high, deactivating switching device 20 and disabling first voltage generator 16.

Figure 5:
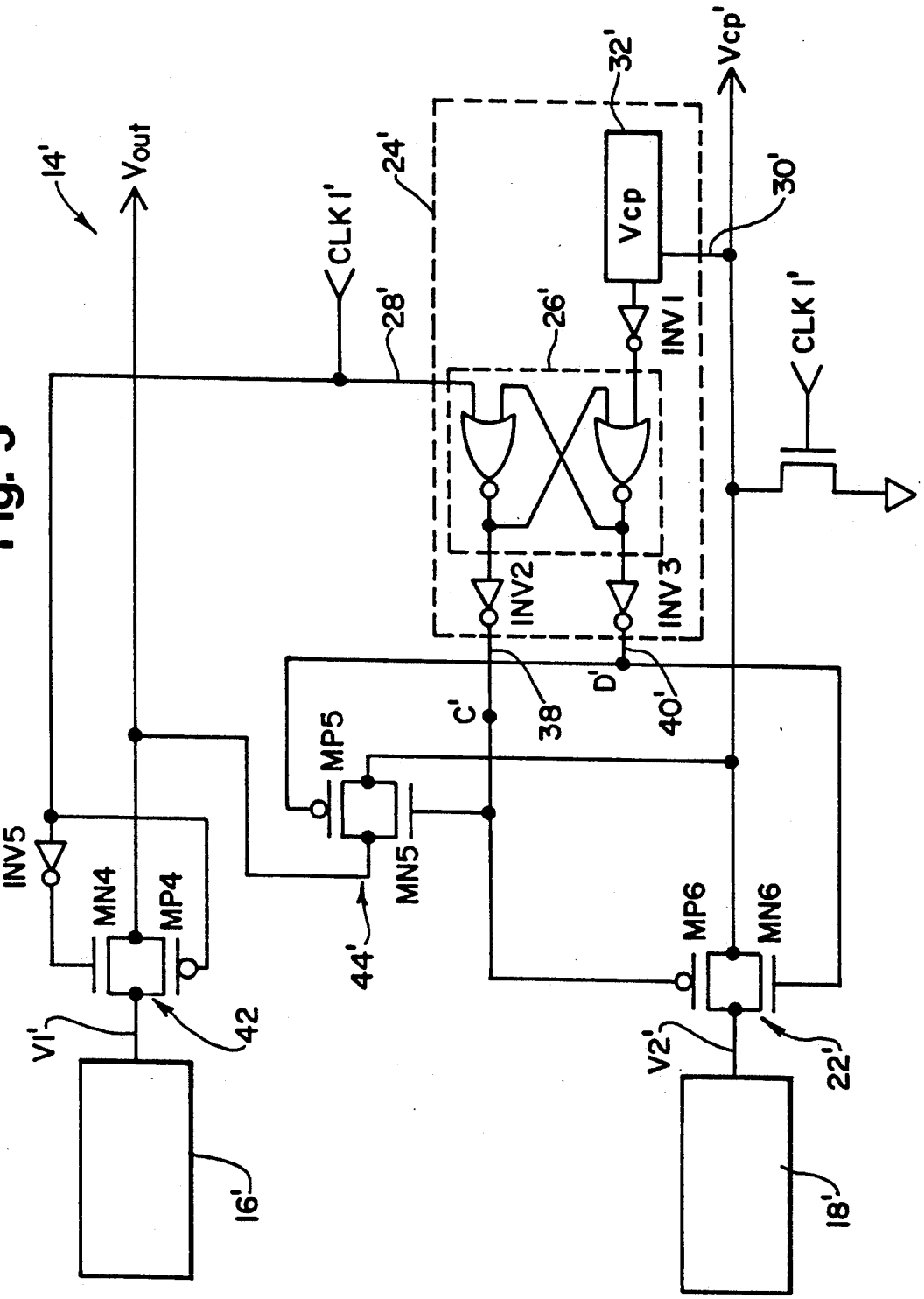
FIG. 5 is a block diagram of a circuit in accordance with a second embodiment of the invention.

FIG. 5 illustrates circuit 14', an alternative embodiment of circuit 10. In circuit 14', first switching device 20 has been eliminated, and replaced by switching devices 42 and 44'. Voltage generator 16' is continuously driven so that a voltage can be continuously supplied. However, output V1' of voltage generator 16' is connected to terminal Vcp' via switching device 42 (including transistors MN4 and MP4) and switching device 44' (including transistors MP5 and MN5).

As shown in FIG. 5, switching device 42 is controlled by the clock signal CLK1', and switching device 44' is controlled by outputs 38' and 40' of control signal generator 24'. The connections of voltage generator 18' and other circuitry are as described in the first embodiment shown in FIG. 3.

Figure 6:
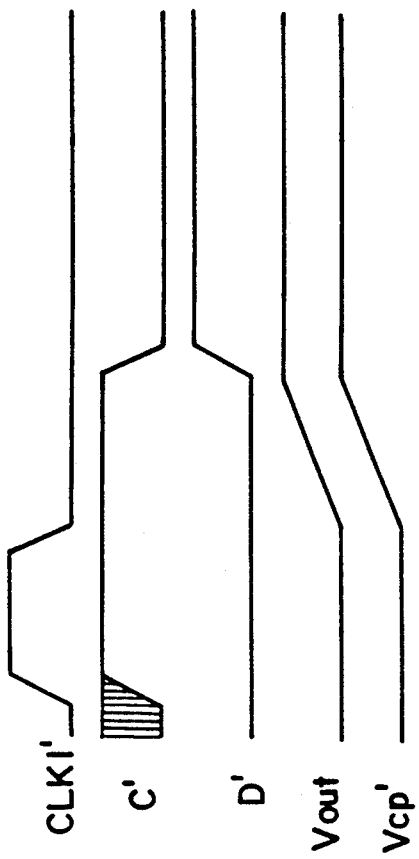
FIG. 6 is a timing chart showing the operation of the circuit shown in FIG. 5.

FIG. 6 is a timing chart illustrating the operation of circuit 14'. Voltage generator 16' begins to generate output as soon as power is turned on. Voltage generator 16' is disconnected from terminal Vcp' by switching device 42, which remains turned off as long as clock signal CLK1' is at a high level. Switching device 44' is on because the control signals are in their first state (output 38' high, output 40' low). Once signal CLK1' drops to a low level, switching device 42 is also turned on, allowing voltage generator 16' to supply terminal Vcp'.

As the voltage of terminal Vcp reaches the critical threshold, RS flip flop 26' is reset by voltage sensor 32' in the manner described with the first embodiment. The control signals change to their second state (output 38' low, output 40' high). Switching device 44' is turned off, uncoupling voltage generator 16' from terminal Vcp'. At the same time, switching device 22' is turned on, connecting voltage generator 18' to terminal Vcp'.

The foregoing embodiments are provide as examples. Modifications and alternatives are possible, and can be made without departing from the invention as recited in the following claims.

What is claimed is:

1. An initial set-up circuit for providing a charging voltage to the plate electrodes of a plurality of memory cell capacitors, comprising:
   first voltage means for generating a voltage to charge the plate electrodes, the first voltage means having a first current driving capacity;
   second voltage means for generating a voltage to charge the plate electrodes, the second voltage means having a second current driving capacity; and
   switching control means coupled to the first and second voltage means and the plate electrodes for:
   initially enabling the first voltage means to charge the plate electrodes; and
   disabling the first voltage means and enabling the second voltage means when the voltage level of the plate electrodes reaches a predetermined threshold.

2. The circuit of claim 1 wherein the first current driving capacity is larger than the second current driving capacity.

3. The circuit of claim 1 wherein the switching control means includes sensor control means coupled to the electrode plates for generating a control signal having a first value initially and a second value once the voltage level of the electrode plates is above the predetermined threshold level.

4. The circuit of claim 3 wherein the switching control means includes switching means coupled to the first and second voltage means and the sensor control means for:
   enabling the first voltage means and disabling the second voltage means when the control signal has the first value; and
   disabling the first voltage means and enabling the second voltage means when the control signal has the second value.

5. The circuit of claim 4 wherein the first voltage means includes a power supply, and wherein the switching means enables and disables the first voltage means by selectively coupling and uncoupling the first voltage means from its power supply.

6. The circuit of claim 4 wherein the first voltage means includes a voltage output, and wherein the switching means enables and disables the first voltage means by selectively coupling and uncoupling the voltage output to the electrode plates.

7. A dynamic memory having a plurality of memory cells, each cell having a capacitor with a plate electrode, the plate electrodes coupled to a common plate node, and a circuit for providing a charging voltage to the common plate node, comprising:
   first voltage means for generating a charging voltage, the first voltage means having a first current driving capacity;
   second voltage means for generating a charging voltage, the second voltage means having a second current driving capacity;
   control means coupled to the plate node for generating a control signal having a first and second state, the control signal being initially set to the first state, and changing to the second state when the plate node voltage reaches a predetermined voltage level; and
   switching means coupled to the first and second voltage means and the control means for:
      selectively activating the first voltage means when the control signal is in the first state;
      deactivating the first voltage means and activating the second voltage means when the control signal is in the second state;
      wherein the first charging capacity is larger than the second charging capacity.

8. The circuit of claim 7 further comprising timer means for generating a clock pulse defining an initial period; wherein the switching means is responsive to the clock pulse for delaying activation of the first voltage means until the expiration of the initial period.

9. The circuit of claim 8 wherein the control means is responsive to the clock pulse for setting the control signal to the first state.

10. The circuit of claim 7 wherein the first voltage means includes a power supply, and wherein the switching means activates and deactivates the first voltage means voltage means by selectively coupling and uncoupling the first voltage means from its power supply.

11. The circuit of claim 7 wherein the first voltage source includes a voltage output, and wherein the switching means enables and disables the first voltage source by selectively coupling and uncoupling the voltage output to the electrode plates.

12. An initial set-up circuit for providing a charging voltage to the plate electrodes of a plurality of memory cell capacitors, comprising:
   first voltage means for generating a charging voltage, the first voltage means having a power supply, a first voltage output coupled to the plate electrodes, and a first current driving capacity;
   second voltage means for generating a charging voltage, the second voltage means having a second voltage output and a second current driving capacity;
   control means coupled to the plate electrodes for generating a control signal initially having a first value and then having a second value when the plate electrode voltage level reaches a threshold level;
   first switching means coupled to the control means for coupling the first voltage means to the power supply in response to the control signal having the first value, and uncoupling the first voltage means from the power supply in response to the control signal having the second value; and
   second switching means coupled to the control means for coupling the second voltage output to the plate electrodes when the control signal has the second value, and uncoupling the second voltage output from the plate electrodes when to the control signal has the first value;
   wherein the first driving capacity is larger than the second driving capacity.

13. The circuit of claim 12 further comprising timer means for generating a clock pulse defining an initial period; wherein the first switching means is responsive to the clock pulse for uncoupling the first voltage means from the power supply during the initial period.

14. The circuit of claim 13 further comprising means responsive to the timer means for coupling the plate electrodes to electrical ground during the initial period.

15. The circuit of claim 13 wherein the control means includes a bistable multivibrator exhibiting first and second states corresponding to the first and second control signal values, respectively, the multivibrator having an input that is coupled to the timer means, and being adapted to entering the first state in response to the clock pulse.

16. The circuit of claim 15 wherein the control means includes detection means for generating a detection signal indicating when the voltage level of the plate electrodes reaches a predetermined level, wherein the bistable multivibrator is responsive to the detection signal for entering the second state when the plate electrode voltage level reaches the predetermined level.

17. An initial set-up circuit for providing a charging voltage to the plate electrodes of a memory cell capacitors, comprising:
   first voltage means for generating a charging voltage, the first voltage means having a first voltage output with a first current driving capacity;
   second voltage means for generating a charging voltage, the second voltage means having a second voltage output with a second current driving capacity;

control means coupled to the plate electrodes for generating a control signal initially having a first value and then having a second value when the plate electrode voltage level reaches a threshold level;

first switching means coupled to the control means for coupling the first voltage output to the plate electrodes in response to the control signal having the first value, and uncoupling the first voltage output from the plate electrodes in response to the control signal having the second value; and second switching means coupled to the control means for coupling the second voltage output to the plate electrodes in response to the control signal having the second value, and uncoupling the second voltage output from the plate electrodes in response to the control signal having the first value;

wherein the first driving capacity is larger than the second driving capacity.

18. The circuit of claim 17 further comprising timer means for generating a clock pulse defining an initial period; wherein the first switching means is responsive to the clock pulse for uncoupling the first voltage output from the plate electrodes during the initial period.

19. The circuit of claim 18 further comprising means for coupling the plate electrodes to electrical ground during the initial period.

20. The circuit of claim 18 wherein the control means includes a bistable multivibrator exhibiting first and second states corresponding to the first and second control signal values, respectively, the multivibrator being responsive to the clock pulse for entering the first state.

21. The circuit of claim 20 wherein the control means includes detection means for generating a detection signal indicating when the voltage level of the plate electrodes reaches a predetermined level, wherein the bistable multivibrator is responsive to the detection signal for entering the second state when the plate electrode voltage level exceeds the predetermined threshold.

22. An initial set-up circuit for providing a charging voltage to the plate electrodes of a plurality of memory cell capacitors, comprising first voltage means for generating a charging voltage, the first voltage means having a first current driving capacity;

second voltage means for generating a charging voltage, the second voltage means having a second current driving capacity;

timing means for generating a clock pulse defining an initial period;

sensor means coupled to the electrode plates for generating a sensor signal which indicates whether the voltage level of the electrode plates has reached a predetermined threshold;

a bistable multivibrator having a first input coupled to the timing means and a second input coupled to the sensor means, wherein the multivibrator exhibits a first stable state in response to the presence of the clock pulse and a second stable sate in response to the sensor signal indicating that the voltage level of the electrode plate exceeds the predetermined threshold;

first switching means coupled to the multivibrator for selectively enabling the first voltage means to charge the plate electrode when the multivibrator exhibits the first stable state;

second switching means coupled to the multivibrator for selectively enabling the second voltage means to charge the plate electrode when the multivibrator exhibits the second stable state;

wherein the first current driving capacity is larger than the second current driving capacity.

23. The circuit of claim 22 wherein the first voltage means includes a power supply, and wherein the first switching means enables and disables the first voltage means by selectively coupling and uncoupling the first voltage means from its power supply.

24. The circuit of claim 22 wherein the first voltage means includes a voltage output, and wherein the switching means enables and disables the first voltage means by selectively coupling and uncoupling the voltage output to the electrode plates.

25. The circuit of claim 22 wherein the bistable multivibrator is an RS flip flop, having inputs R and S, the S input being coupled to the timing means, and the R input being coupled to the sensor means.

26. The circuit of claim 22 further comprising grounding means for selectively coupling the plate electrodes to ground during the initial period, wherein the first switching means is responsive to the timing means for disabling the first voltage means during the initial period.

27. A method for charging the plate electrodes of memory cells, comprising the steps of:

applying a first voltage source to the plate electrodes having a first current driving capacity;

detecting when the voltage level of the plate electrodes reaches a predetermined threshold;

once the voltage level reaches the predetermined threshold, removing the first voltage source and applying a second voltage source to the plate electrodes once the plate electrodes reach a predetermined threshold voltage level, the second voltage source having a second current driving capacity that is lower than the first current driving capacity.

28. The method of claim 27 further comprising the steps of generating a clock pulse that defines an initial period; and coupling the plate electrodes to ground during the initial period.

29. The method of claim 28 wherein the step of applying the first voltage source commences after the initial period.

* * * * *

UNITED STATES PATENT AND TRADEMARK OFFICE
CERTIFICATE OF CORRECTION

PATENT NO. : 5,305,270
DATED : April 19, 1994
INVENTOR(S) : Tae H. Kim

It is certified that error appears in the above-identified patent and that said Letters Patent is hereby corrected as shown below: Title page;
Inventor: Tae H. Kim, Seoul, Rep. of Korea Signed and Sealed this Twenty-first Day of October 1997

Attest:

BRUCE LEHMAN

*Attesting Officer*  *Commissioner of Patents and Trademarks*